United States Patent [19]

Guha

[11] Patent Number: 5,719,076
[45] Date of Patent: Feb. 17, 1998

[54] METHOD FOR THE MANUFACTURE OF SEMICONDUCTOR DEVICES WITH OPTIMIZED HYDROGEN CONTENT

[75] Inventor: Subhendu Guha, Troy, Mich.

[73] Assignee: United Solar Systems Corporation, Troy, Mich.

[21] Appl. No.: 637,187

[22] Filed: Apr. 24, 1996

[51] Int. Cl.$^6$ .................................................. H01L 31/20
[52] U.S. Cl. ........................... 438/96; 136/258; 257/458
[58] Field of Search ................. 136/258 AM; 257/458, 257/53, 55, 63, 65; 437/4; 438/96

[56] References Cited

U.S. PATENT DOCUMENTS

| | | | |
|---|---|---|---|
| 4,816,082 | 3/1989 | Guha et al. | 136/249 |
| 4,857,976 | 8/1989 | Overhauser et al. | 136/258 AM |
| 5,114,498 | 5/1992 | Okamoto et al. | 136/258 AM |
| 5,204,272 | 4/1993 | Guha et al. | 437/4 |
| 5,256,576 | 10/1993 | Guha et al. | 437/4 |

FOREIGN PATENT DOCUMENTS

| | | | |
|---|---|---|---|
| 3-106079 | 5/1991 | Japan | 136/258 AM |
| 3-155860 | 7/1991 | Japan | 136/258 AM |
| 3-177077 | 8/1991 | Japan | 136/258 AM |
| 4-33378 | 2/1992 | Japan | 136/258 AM |

*Primary Examiner*—Aaron Weisstuch
*Attorney, Agent, or Firm*—Gifford, Krass, Groh, Sprinkle, Patmore, Anderson & Citkowski, P.C.

[57] ABSTRACT

A semiconductor device which includes a layer of hydrogenated semiconductor alloy material has the hydrogen content of that semiconductor layer optimized by the inclusion of a hydrogen-rich body of reservoir material in the device. Migration of hydrogen from the reservoir to the semiconductor layer provides and maintains an optimum hydrogen content in the semiconductor layer.

2 Claims, 1 Drawing Sheet

METHOD FOR THE MANUFACTURE OF SEMICONDUCTOR DEVICES WITH OPTIMIZED HYDROGEN CONTENT

FIELD OF THE INVENTION

This invention relates generally to semiconductor devices and their manufacture. More particularly the invention relates to semiconductor devices fabricated from thin film, hydrogenated semiconductor alloy materials. Most specifically, the invention relates to semiconductor devices including a hydrogen-rich reservoir layer for optimizing the hydrogen content of active semiconductor layers.

BACKGROUND OF THE INVENTION

Hydrogenated semiconductor alloy materials, particularly group IV materials, and most particularly silicon and germanium-based hydrogenated, semiconductor alloy materials, are of ever growing utility in the fabrication of a variety of semiconductor devices including photovoltaic devices, photoconductive devices and purely electronic devices such as thin film transistors. These alloys manifest good electrical and physical properties and may be readily deposited over large areas by a number of commercially viable deposition techniques. Such materials may comprise amorphous, crystalline, microcrystalline, or polycrystalline alloys of silicon with alloying elements such as hydrogen, halogens, germanium, carbon, nitrogen, tin, lead, and the like. These alloys may also be doped with group III or group V elements so as to alter their conductivity type.

The hydrogen content of hydrogenated semiconductor alloy materials is an important factor which controls their electronic and optical properties. It has been found that the band gap of the alloys generally increases with increasing hydrogen content. It has also been found that the dark conductivity of hydrogenated silicon alloys decreases as hydrogen content increases, and it is speculated that hydrogen plays a role in passivating defective bonding states and relieving stress in the matrix of the semiconductor materials, thereby improving their electronic properties. In general, hydrogenated silicon alloy materials, of the type utilized in thin film photovoltaic devices, preferably have a hydrogen content in the range of 8–12 atomic percent. Similar relationships have been found for germanium alloy materials and silicon/germanium alloy materials.

Presently, there are a number of deposition techniques known, and available to those of skill in the art, for the preparation of thin film layers of hydrogenated semiconductor alloys. The choice of a particular deposition technique will be mandated by a number of factors including the need for a high rate of deposition, the economics of the deposition process, and the compatibility of the deposition process with other processing parameters. A particular deposition process may be favored by a number of such considerations, but may also be otherwise unattractive since it may produce a semiconductor material having poor electronic properties. The hydrogen content of semiconductor alloy materials has been found to be highly dependent upon deposition conditions, and a number of deposition techniques produce semiconductor alloy materials having less than optimum electronic and optical properties because of a low hydrogen content.

For example, substrate temperature has been found to correlate inversely with the hydrogen content of silicon alloy materials. As substrate temperature increases, the hydrogen content decreases. However, in a number of instances, such as when very high deposition rate techniques, such as microwave energized glow discharge deposition processes are employed, a fairly high substrate temperature is required in order to impart sufficient kinetic energy to the depositing species so as to provide for relaxation and reconfiguration of strained bent or deviant bending morphologies. While high substrate temperatures are needed, they also tend to produce films having too low a hydrogen content; therefore, a tradeoff between substrate temperature, deposition rate, and film quality must frequently be made. Other deposition techniques such as homogeneous chemical vapor deposition, and hot wire chemical vapor deposition also tend to produce semiconductor films having an undesirably low hydrogen content. In addition to the foregoing, hydrogen content of semiconductor alloy films may also be adversely lowered by subsequent processing steps such as electrode deposition, annealing, and the like.

As a consequence, it is known in the prior art to apply various post deposition hydrogenation treatments to thin film alloy materials. Such treatments, generally referred to as post hydrogenation treatments, comprise exposing semiconductor layers or devices to a hydrogen plasma. While such techniques do provide for some improvement to the electronic properties of the semiconductor materials, they are not entirely adequate. A hydrogen plasma can actually etch away portions of the semiconductor layer. In addition, it is difficult to diffuse activated hydrogen very far into a semiconductor device, and this problem is greatly compounded when the device is a multi-layered device such as a stacked, tandem photovoltaic device. While post hydrogenation may restore an optimum hydrogen concentration to upper levels of a semiconductor layer or device, it frequently cannot improve material quality of lower portions of the layer or device. As will be described in greater detail hereinbelow, the present invention provides a device configuration, and method, wherein a hydrogen reservoir is disposed within a semiconductor device, and operates to provide a controlled release of hydrogen to optimize the electronic properties of other portions of the device.

The problem of low hydrogen content is particularly significant in P-I-N type photovoltaic devices manufactured by high substrate temperature deposition techniques, or other deposition processes which cause a loss of hydrogen. In devices of this type, the increased dark conductivity resultant from low hydrogen content will decrease the output voltage, and hence overall efficiency of the device. Post hydrogenation treatment in an activated hydrogen atmosphere may be capable of addressing the material quality at the upper doped/intrinsic interface (typically the P-I interface for those cells in which a P-doped layer is grown on an I-layer) of the device, but cannot reach the bottommost (typically N-I) interface.

The prior art has not been able to provide any solution to the aforedescribed problem. U.S. Pat. No. 4,816,082 discloses a deposition process for the preparation of a P-I-N type photovoltaic device wherein the free surface of the freshly deposited intrinsic layer is passivated by treatment with a hydrogen plasma, prior to the deposition of the P layer thereonto. There is no showing in this patent of the need for restoring a proper hydrogen content to a photovoltaic device, nor is there any showing of any process which can create or maintain a hydrogen rich reservoir layer in a device. In some instances, the prior art has fabricated P-I-N type photovoltaic devices in which the band gap of the intrinsic layer is profiled throughout the thickness of that layer, and gap widening may be accomplished by increasing the hydrogen content of portions of the thickness of the intrinsic layer. Devices of this type are shown in U.S. Pat.

Nos. 5,204,272 and 5,256,576. In these patents, all of the gap profiling takes place in the intrinsic layer. Neither of these patents identify the problem of hydrogen loss, nor do they suggest the utilization of a hydrogen releasing reservoir layer for solving the problem.

As will be described in greater detail hereinbelow, the present invention provides for the manufacture of photovoltaic devices having optimized optical and electronic properties in the various semiconductor layers thereof, independently of deposition processes employed for the fabrication of those layers. Through the use of the present invention, deposition processes and resultant material quality are decoupled, and may be independently optimized. These and other advantages of the present invention will be readily apparent from the drawings, discussion and description which follow.

BRIEF DESCRIPTION OF THE INVENTION

There is disclosed herein a P-I-N type photovoltaic device having an intrinsic semiconductor layer therein. The device includes an electrode, and a triad of semiconductor layers in electrical communication with the electrode. The triad includes a layer of substantially intrinsic, hydrogenated semiconductor alloy material interposed between a first, doped semiconductor layer of a first conductivity type and a second, doped semiconductor layer of a second conductivity type, opposite said first conductivity type. In accord with the present invention, the device further includes a body of hydrogen-rich material disposed between the layer of substantially intrinsic semiconductor material and the electrode. The body of hydrogen-rich material has a hydrogen content greater than the hydrogen content of the substantially intrinsic, hydrogenated semiconductor alloy material. In this device, hydrogen from the hydrogen rich material will diffuse into the hydrogenated semiconductor alloy material to maintain and/or restore an optimized hydrogen content therein.

In one particular embodiment, the body of hydrogen-rich material is comprised of at least a portion of one of the first or second doped semiconductor layers; whereas, in other embodiments, the body of hydrogen-rich material is a layer of material separate from the first doped semiconductor layer or the second doped semiconductor layer. In some embodiments, the body of hydrogen rich material has a hydrogen content which is at least 50% greater than the hydrogen content of the layer of substantially intrinsic, hydrogenated semiconductor material. In a particular embodiment of the invention, the layer of hydrogen-rich material has a hydrogen content in the range of 10-20 atomic percent. The layer of substantially intrinsic, hydrogenated semiconductor alloy material may comprise a layer of a hydrogenated, group IV semiconductor alloy material.

In some particular embodiments, the device includes a substrate which provides the electrode of the device. The substrate may be a metallic substrate, or it may comprise an electrically insulating substrate having a layer of electrically conductive material thereupon.

The present invention is further directed to a semiconductor device having an optimized hydrogen content in a semiconductor layer thereof. The device comprises a first electrode and a first semiconductor layer comprising a body of a hydrogenated semiconductor alloy. The device further includes a body of hydrogen-rich material disposed between the first semiconductor layer and the first electrode. The body of hydrogen-rich material has a hydrogen content greater than the hydrogen content of the hydrogenated semiconductor alloy material. In this device, the hydrogen from the hydrogen-rich material diffuses into the hydrogenated semiconductor alloy. The present invention is also directed to methods for the fabrication of the aforedescribed semiconductor devices.

DETAILED DESCRIPTION OF THE INVENTION

Figure 1:
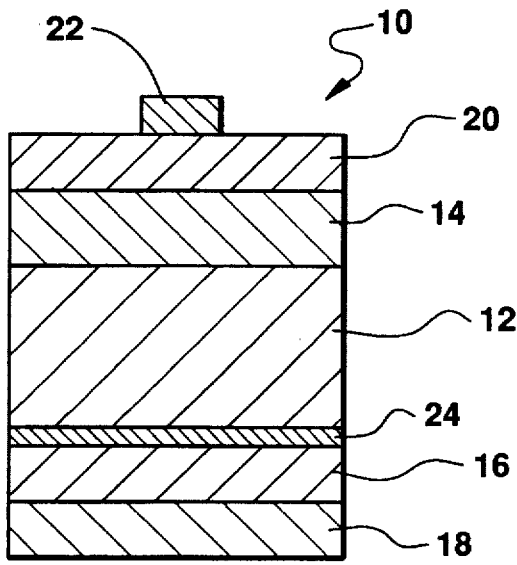
FIG. 1 is a cross-sectional view of a first embodiment of a photovoltaic device structured in accord with the principles of the present invention.

The present invention is operative to provide a semiconductor device in which the hydrogen content of one or more layers of hydrogenated semiconductor alloy material comprising the device is controlled so that the electronic properties of that alloy material are maximized. The present invention operates to control the hydrogen content of the semiconductor layer by providing a body of hydrogen-rich material, separate from the layer, which body functions as a hydrogen reservoir. The hydrogen content of the hydrogen-rich material is greater than the hydrogen content of the alloy material, and an equilibration will take place wherein hydrogen will migrate from the reservoir layer to the alloy layer so as to optimize the hydrogen content thereof.

The composition, thickness and placing of the reservoir layer will depend upon the amount of hydrogen that needs to be displaced into the alloy layer. Generally, the hydrogen content of the reservoir layer should be at least 25% greater than the hydrogen content of the semiconductor alloy layer in question. More preferably, the reservoir layer will have a hydrogen content which is at least 50% greater than that of the semiconductor layer; that is to say, if the layer of semiconductor alloy material has a hydrogen content of 6 atomic percent, the reservoir layer will have a hydrogen content of at least 9 atomic percent. This differential in hydrogen content will provide a concentration gradient driving the diffusion process. In addition to hydrogen concentration, the total hydrogen content of the reservoir body should also be taken into account so that the body will contain sufficient hydrogen to satisfy the requirements of the semiconductor alloy layer. Accordingly, it will be readily apparent to one of skill in the art that both the concentration of hydrogen in the reservoir body, and the volume of the reservoir body itself, may be controlled so as to control the amount of hydrogen delivered to the semiconductor alloy layer.

As will be explained in greater detail hereinbelow, the body of hydrogen-rich reservoir material may, in some instances, comprise all, or a portion, of a layer of material which is an active component of the semiconductor device; whereas, in other instances, the reservoir may be a distinct and separate body of material, functioning only as a reservoir. In some instances, a device may include a number of separate hydrogen reservoirs. In yet other instances, the hydrogen reservoir of the present invention may be employed in combination with conventional post hydrogenation treatment of devices.

The present invention is applicable to a broad group of semiconductor devices which include a layer of hydrogenated semiconductor alloy material therein. The present invention may be applied with particular advantage to the fabrication of thin film photovoltaic devices which include hydrogenated group IV semiconductor alloy materials therein, and the present invention will be described with particular reference to such devices; however, it is to be understood that the invention is not so limited, and one of skill in the art could readily apply the teachings present herein to fabrication of other devices.

Referring now to FIG. 1, there is shown a P-I-N type photovoltaic device structured in accord with the principles of the present invention. The device 10 of FIG. 1 includes a layer of substantially intrinsic, hydrogenated semiconductor alloy material, which in this instance is a layer 12 of hydrogenated amorphous silicon. The layer 12 is referred to as being a substantially intrinsic layer in recognition of the fact that it may include traces of N-type or P-type dopants therein. The layer of substantially intrinsic material 12 is interposed between a layer 14 of P doped, hydrogenated silicon alloy material and a layer 16 of N doped hydrogenated silicon alloy material. In a most preferred embodiment, the layer of P doped material 14 is a microcrystalline silicon alloy material having high electrical conductivity and high transparency. The triad of P, I, and N layers comprise a P-I-N type photovoltaic cell as is well known in the art. The device further includes a substrate layer 18, which in this instance has the layer of N type material 16 supported thereupon. The substrate 18 also functions as a bottom electrode of the photovoltaic device 10. The substrate 18 may be fabricated from a sheet of metallic material, or it may be fabricated from an insulating body, in which instance a layer of electrically conductive material is disposed thereupon, in electrical communication with the N layer 16. For example, the substrate 18 may comprise a body of glass having a transparent, electrically conductive layer thereupon; or the substrate 18 may comprise a polymeric body having a metallic layer deposited thereupon. It is also to be understood that the substrate 18 may further include reflective layers, texturizing layers, and the like as is well known in the art, and all of such layers will collectively comprise the element defined as the substrate within the context of this disclosure.

The photovoltaic device 10 of FIG. 1 further includes a layer of top electrode material 20 in electrical communication with the P layer 14, and may also include a current collecting grid 22 in communication with the top electrode material 20. In those instances where the device 10 of FIG. 1 is configured for illumination from the top electrode side, the top electrode 20 will be light transmissive and will preferably be fabricated from a transparent conductive oxide material as is well known in the art. In those instances where the device 10 is configured for illumination from the substrate side, the top electrode 20 may be a metallic electrode.

In accord with the present invention, a body 24 of hydrogen-rich material is interposed between the intrinsic layer 12 and one of the electrodes, in this instance the substrate 18. The body of hydrogen-rich material 24 will most preferably have a hydrogen content which is at least 50% greater than the hydrogen content of the intrinsic layer 12. Typically, an optimum hydrogen concentration for a hydrogenated silicon alloy material is in the range of 8–12 percent; however, high substrate temperature deposition techniques can lower this level significantly. If, for example, the deposition technique produces an intrinsic layer 12 with a final hydrogen concentration of 6%, and if the optimum hydrogen concentration for that layer should be approximately 10%, inclusion of a reservoir layer 24 having a hydrogen content in excess of the hydrogen content of the as-deposited, intrinsic layer will cause the migration of hydrogen into the intrinsic layer 12 from the reservoir layer 24. Hydrogen migration will continue until the levels in the two layers are equilibrated. Therefore, it is generally desirable that the hydrogen content of the reservoir layer not only exceed the hydrogen content of the as deposited intrinsic layer; but that it be equal to, and preferably slightly more than, the final desired hydrogen content of the intrinsic layer. For example, in the photovoltaic device described above, the hydrogen content of the as deposited intrinsic layer 12 is approximately 6%. The reservoir layer 24 has a hydrogen content of approximately 12%; therefore, hydrogen will migrate from the reservoir layer 24 into the intrinsic layer 12 raising its hydrogen content, and likewise decreasing the hydrogen content in the reservoir layer 24. The hydrogen content of the reservoir layer 24, as well as the volume of hydrogen included therein, is selected so that at equilibrium, the hydrogen content in the reservoir layer 24 as well as the intrinsic layer 12 will be approximately 10%, which is determined ideal for this particular device. Similar adjustments and calculations may be made for differently configured devices, and for semiconductor layers deposited with different hydrogen concentrations.

As illustrated, the reservoir layer 24 is shown as being separate from the layer of N type material 16. It is to be understood that, in some embodiments, the reservoir may comprise a portion, or all, of the N type layer 16. It is well known in the art that the hydrogen content of a glow discharge deposited group IV semiconductor alloy material may be increased by decreasing the substrate temperature during deposition or by increasing the level of power applied to the plasma. A portion, or the entirety, of the N layer 16 may be deposited under conditions favoring the deposition of a high hydrogen content layer, and the high hydrogen portion of this layer 16 may then function as the hydrogen reservoir. In a P-I-N type photovoltaic device, the electronic properties of the intrinsic layer are more critical to device performance than are those of the doped layers, and any degradation of the electronic properties of the N layer 16 resultant from the low temperature and/or high power used in its preparation will be offset by the improvement in the properties of the intrinsic layer 12, with an overall net improvement in the performance of the device 10.

The hydrogen content of the entire N layer 16 may be increased, in which instance the reservoir layer 24 and N layer 16 will be coextensive and identical. As specifically illustrated in FIG. 1, the reservoir layer 24 may be comprised of only a portion of the thickness of the N layer 16, and this may be accomplished by changing the deposition conditions during the preparation of a portion of the N layer 16.

It is also contemplated that, within the scope of the present invention, the reservoir layer 24 may be compositionally distinct from the N layer 16. For example, the reservoir layer 24 may comprise any material which is capable of releasably retaining hydrogen, and which is compatible with the photovoltaic device. The reservoir layer is preferably electrically conductive so as to not introduce any unwanted series resistance in the photovoltaic device; however, in some instances the reservoir layer may be insulating or of low electrical conductivity; in which case, it may be made discontinuous so as to permit passage of current therethrough.

Figure 2:
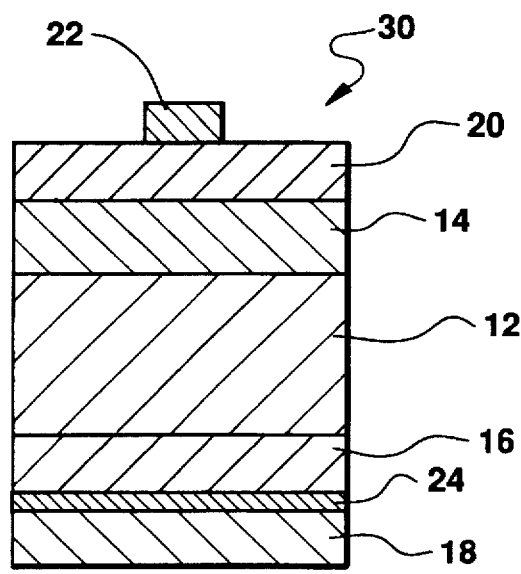
FIG. 2 is a cross-sectional view of another embodiment of a photovoltaic device structured in accord with the principles of the present invention.

Referring now to FIG. 2, there is shown a photovoltaic device 30 generally similar to that of FIG. 1, and like structures will be referred to therein by like reference numerals. As in FIG. 1, the device of FIG. 2 includes a substrate 18 which functions as a bottom electrode of the device; a triad of P 14, I 12, and N 16 semiconductor layers supported upon the substrate, a top electrode 20 and a grid 22. The device 30 of FIG. 2 further includes a hydrogen-rich body of reservoir material 24 as previously described. In the FIG. 2 embodiment 30, the reservoir layer 24 is interposed between the substrate 18 and the N layer 16. In some instances it may be preferable to so dispose the reservoir layer 24 so as to maintain a good electrical interface between the N doped 16 and intrinsic layer 12. This embodiment may be found to be most advantageous in those instances where the reservoir material 24 is not comprised of a portion of the N doped layer 16, or where the hydrogen content of the reservoir layer 24 and/or various deposition conditions are such that the band structure of the triad will be adversely affected.

In some particular instances it has been found that metal hydrides such as nickel-based metal hydrides, of the type employed in hydride batteries, will provide good hydrogen reservoirs. These hydrides may be deposited by various thin film deposition techniques, and are of high electrical conductivity and capable of releasably storing large amounts of hydrogen. As illustrated in FIG. 2, the reservoir layer 24 may comprise a layer of a metallic hydride material disposed upon the substrate 18.

Figure 3:
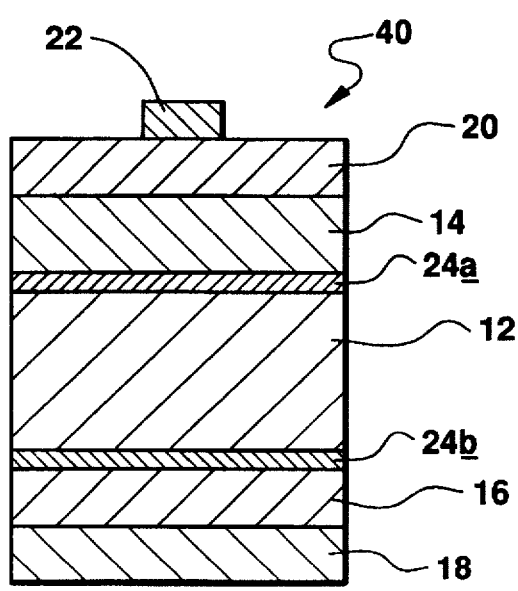
FIG. 3 is a cross-sectional view of a third embodiment of a photovoltaic device structured in accord with the principles of the present invention.

Referring now to FIG. 3, there is shown yet another embodiment of photovoltaic device 40 structured in accord with the principles of the present invention. The device 40 of FIG. 3 includes a substrate 18 having a triad of P type 14, I type 12, and N type layers 16 supported thereupon, together with a top electrode 20 and a current collecting grid 22. The device 40 of FIG. 3 includes two hydrogen rich reservoir layers 24a, 24b disposed on either side of the intrinsic layer 12. As in the previous embodiments, the reservoir layers may be derived from the proximate doped layers 14 and 16, or they may be compositionally different. It is to be further understood that while the layers 24a, 24b are shown as being directly adjacent the intrinsic layer 12, the layers may be otherwise positioned as shown in FIG. 2. In some instances, a single hydrogen reservoir may be disposed between the intrinsic layer and a top electrode layer of a device and will suffice to provide enough hydrogen to the entirety of the device, in which instance the device will not include a reservoir layer between the intrinsic body and substrate. This particular embodiment may be beneficially employed when the intrinsic layer is thin, readily permeable to hydrogen or otherwise accessible to hydrogen from the reservoir. In such instances, use of the reservoir of the present invention may be an easy to implement alternative to various post-hydrogenation treatments previously employed.

While FIGS. 1–3 illustrate single cell devices, that is to say devices including only a single triad of P-I-N type layers, it is to be understood that the principles of the present invention may be employed in the manufacture of tandem photovoltaic cells, with particular advantage. As is known in the art, tandem devices comprise a stacked array of photovoltaic cells, typically of P-I-N type configuration disposed optically and electrically in series. In accord with the teachings herein, some, or all, of the intrinsic layers of a tandem device may have their hydrogen content optimized by the inclusion of one or more reservoir layers in the device. As noted above, the problem of introducing hydrogen to the lower layers of a tandem device by conventional post hydrogenation treatments is very difficult owing to the thickness of the devices; therefore, it is to be appreciated that the present invention has particular utility in the fabrication of tandem devices.

While the present invention has been described with reference to particular photovoltaic devices, it is to be understood that in view of the teaching herein the invention may be readily employed in combination with the fabrication of photovoltaic devices of other configuration as well as with other electronic devices which include hydrogenated semiconductor layers. The foregoing drawings, discussion and description are merely meant to illustrate particular embodiments of the present invention, but are not meant to be limitations upon the practice thereof. It is the following claims, including all equivalents, which define the scope of the invention.

I claim:

1. A method for providing an optimum hydrogen content in a layer of hydrogenated semiconductor alloy material which is included in a semiconductor device of the type comprising: an electrode and a semiconductor layer comprising a body of a hydrogenated semiconductor alloy in electrical communication with said electrode, said method comprising the steps of:

determining an optimum hydrogen content for said layer of hydrogenated semiconductor alloy material;

depositing said layer of hydrogenated semiconductor alloy material, whereby said layer, as deposited, has a hydrogen content which is less than the optimum hydrogen content thereof;

disposing a body of hydrogen-rich material between the semiconductor layer and the electrode, said body of hydrogen-rich material having a hydrogen content greater than the optimum hydrogen content of said hydrogenated semiconductor alloy; and allowing hydrogen to migrate from said body of hydrogen rich material to said layer of hydrogenated semiconductor alloy material; whereby the hydrogen content of said layer is increased to said optimum.

2. A method of making a P-I-N type photovoltaic device having an optimum hydrogen content in an intrinsic semiconductor layer thereof, said method comprising the steps of:

determining an optimum hydrogen content for said intrinsic semiconductor layer;

providing a first electrode;

depositing a first, doped, body of a semiconductor material, of a first conductivity type, in electrical communication with said first electrode;

depositing said intrinsic semiconductor layer so that a first surface thereof is in electrical communication with said first, doped body, said intrinsic semiconductor layer being deposited by a process wherein the hydrogen content of the layer, as deposited, is less than said optimum hydrogen content;

depositing a second, doped body of a semiconductor material, of a second conductivity type, opposite said first conductivity type, in electrical communication with a second surface of said layer;

disposing a body of hydrogen-rich material between the intrinsic semiconductor layer and the electrode, said body of hydrogen-rich material having a hydrogen content greater than the optimum hydrogen content of the intrinsic semiconductor layer; and allowing hydrogen to migrate from said body of hydrogen-rich material to said intrinsic semiconductor layer; whereby the hydrogen content of said intrinsic semiconductor layer is increased to said optimum.

* * * * *